(12) United States Patent
Chen et al.

(10) Patent No.: US 9,960,083 B1
(45) Date of Patent: May 1, 2018

(54) METHOD FOR FABRICATING SEMICONDUCTOR DEVICE

(71) Applicant: UNITED MICROELECTRONICS CORP., Hsin-Chu (TW)

(72) Inventors: Tai-You Chen, Changhua County (TW); Cheng-Guo Chen, Changhua County (TW); Kun-Yuan Wu, Kaohsiung (TW); Chiu-Sheng Ho, Taichung (TW); Po-Kang Yang, Taoyuan (TW); Ta-Kang Lo, Taoyuan (TW); Shang-Jr Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 31 days.

(21) Appl. No.: 15/342,114

(22) Filed: Nov. 2, 2016

(51) Int. Cl.
    *H01L 21/8238* (2006.01)
    *H01L 27/092* (2006.01)
    *H01L 29/66* (2006.01)
    *H01L 21/306* (2006.01)
    *H01L 21/308* (2006.01)
    *H01L 21/28* (2006.01)
    *H01L 29/49* (2006.01)

(52) U.S. Cl.
    CPC ........ *H01L 21/823807* (2013.01); *H01L 21/28088* (2013.01); *H01L 21/308* (2013.01); *H01L 21/30604* (2013.01); *H01L 21/823821* (2013.01); *H01L 21/823842* (2013.01); *H01L 27/0922* (2013.01); *H01L 27/0924* (2013.01); *H01L 29/4966* (2013.01); *H01L 29/66545* (2013.01)

(58) Field of Classification Search
    CPC ......... H01L 21/823807; H01L 27/0924; H01L 27/0922; H01L 21/823821; H01L 29/4966; H01L 29/66545; H01L 21/30604; H01L 21/308; H01L 21/28088; H01L 21/823842
    USPC ........................................................ 438/229
    See application file for complete search history.

(56) References Cited

U.S. PATENT DOCUMENTS

| | | | |
|---|---|---|---|
| 7,843,000 B2 * | 11/2010 | Yu | H01L 29/66795 257/330 |
| 7,947,591 B2 * | 5/2011 | Hsu | H01L 29/7833 438/216 |
| 8,432,002 B2 * | 4/2013 | Haran | H01L 29/66545 257/388 |
| 8,796,128 B2 * | 8/2014 | Edge | H01L 21/82345 257/392 |
| 9,246,002 B2 | 1/2016 | Hsiao | |

* cited by examiner

*Primary Examiner* — Vu A Vu
(74) *Attorney, Agent, or Firm* — Winston Hsu

(57) ABSTRACT

First, a substrate having a first region and a second region is provided, a first gate structure is formed on the first region and a second gate structure is formed on the second region, an interlayer dielectric (ILD) layer is formed around the first gate structure and the second gate structure, and the first gate structure and the second gate structure are removed to expose the substrate on the first region and the second region. Next, part of the substrate on the first region is removed to form a first recess and part of the substrate on the second region is removed to form a second recess, in which the depths of the first recess and the second recess are different. Next, a first metal gate is formed on the first region and a second metal gate is formed on the second region.

10 Claims, 3 Drawing Sheets

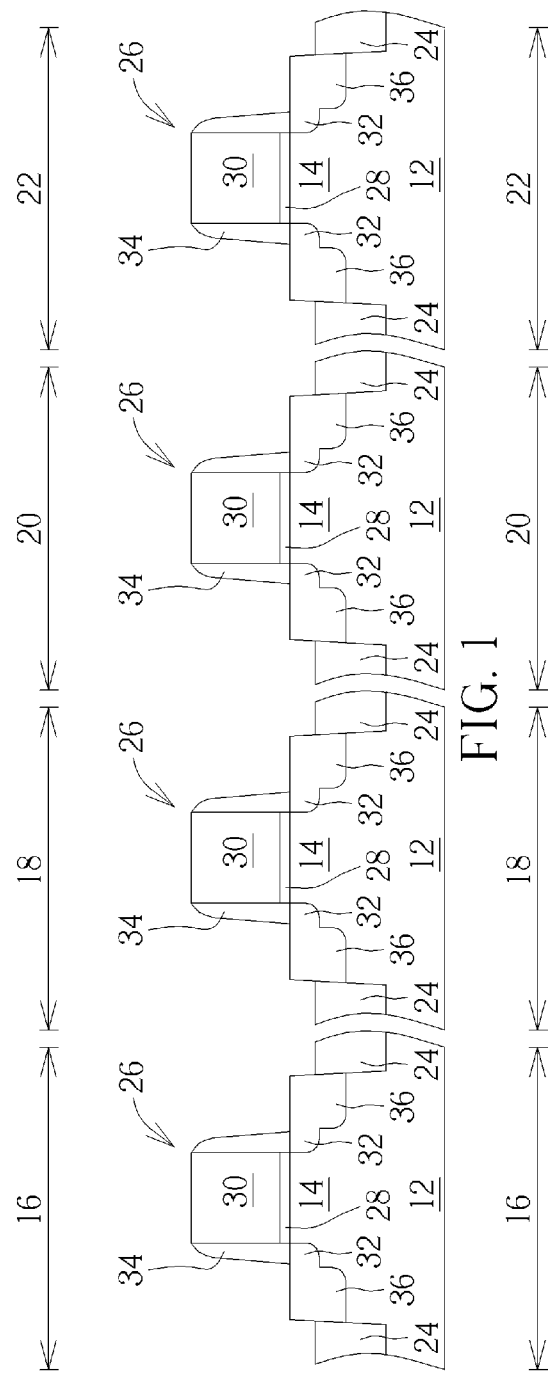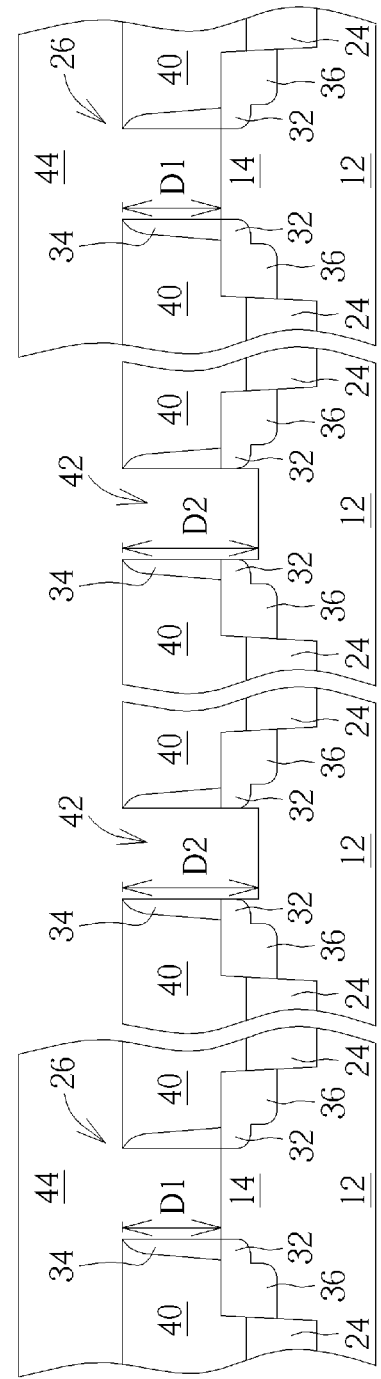

ns of the present invention will
METHOD FOR FABRICATING SEMICONDUCTOR DEVICE

BACKGROUND OF THE INVENTION

1. Field of the Invention

The invention relates to a method for fabricating semiconductor device, and more particularly to a method of achieving multi fin heights in a FinFET process.

2. Description of the Prior Art

With the trend in the industry being towards scaling down the size of the metal oxide semiconductor transistors (MOS), three-dimensional or non-planar transistor technology, such as fin field effect transistor (FinFET) technology has been developed to replace planar MOS transistors. Since the three-dimensional structure of a FinFET increases the overlapping area between the gate and the fin-shaped structure of the silicon substrate, the channel region can therefore be more effectively controlled. This way, issues such as drain-induced barrier lowering (DIBL) effect and short channel effect are reduced. The channel region is also longer for an equivalent gate length so that the current between the source and the drain is increased. In addition, the threshold voltage of the fin FET can be controlled by adjusting the work function of the gate.

In the past, diffusion widths could be designed freely with planar MOS devices. However, as the widths of FinFET structures change from continuous to discrete throughout the decades, the limit of optimization circuit for SRAM and analog or mixed signal designers also increases accordingly. For instance, it has now become a difficult task for designers to obtain a special on current from discrete fin number. Hence, how to alter the current fabrication process to resolve this issue has become an important task in this field.

SUMMARY OF THE INVENTION

According to a preferred embodiment of the present invention, a method for fabricating semiconductor device is disclosed. First, a substrate having a first region and a second region is provided, a first gate structure is formed on the first region and a second gate structure is formed on the second region, an interlayer dielectric (ILD) layer is formed around the first gate structure and the second gate structure, and the first gate structure and the second gate structure are removed to expose the substrate on the first region and the second region. Next, part of the substrate on the first region is removed to form a first recess and part of the substrate on the second region is removed to form a second recess, in which the depths of the first recess and the second recess are different. Next, a first metal gate is formed on the first region and a second metal gate is formed on the second region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-3 illustrate a method for fabricating a semiconductor device according to an embodiment of the present invention.

DETAILED DESCRIPTION

Figure 3:
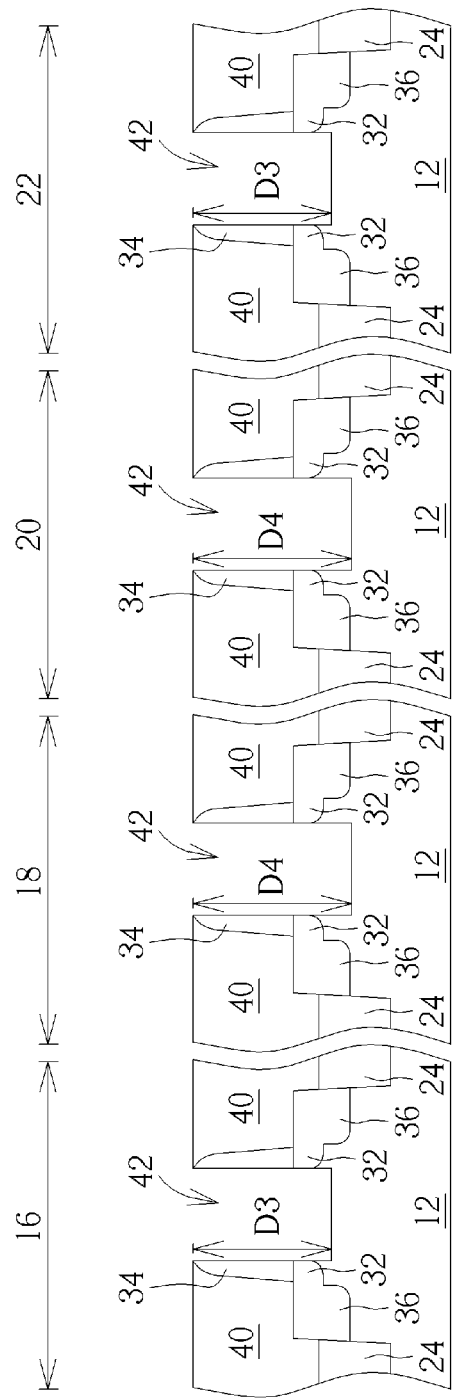

Referring to FIGS. 1-3, FIGS. 1-3 illustrate a method for fabricating a semiconductor device according to a first embodiment of the present invention. As shown in FIG. 1, a substrate 12 is provided, at least a fin-shaped structure 14 is formed on the substrate 12, four transistor regions including a first region 16, a second region 18, a third region 20, and a fourth region 22 are defined on the substrate 12, a shallow trench isolation (STI) 24 is formed in the substrate 12 to separate the transistor regions 16, 18, 20, 22, and four dummy gates or gate structures 26 are formed on the substrate 12. In this embodiment, the four transistors regions 16, 18, 20, 22 could share same or different conductive types, such as all being NMOS regions, all being PMOS regions, or part of the regions being NMOS regions and part of the regions being PMOS regions. It should be noted that even though this embodiment pertains to a FinFET process, it would also be desirable to apply the process of this embodiment to a planar MOS transistor, which is also within the scope of the present invention.

Preferably, the formation of the gate structures 26 could be accomplished by a gate first process, a high-k first approach from gate last process, or a high-k last approach from gate last process. Since this embodiment follows a similar high-k last approach typically carried out in a metal-oxide semiconductor (MOS) transistor fabrication, it would be desirable to sequentially deposit a gate dielectric layer or interfacial layer, a gate material layer, and a selective hard mask on the substrate 12, conduct a pattern transfer process by using a patterned resist (not shown) as mask to remove part of the gate material layer and part of the gate dielectric layer, and then strip the patterned resist to form dummy gates or gate structures 26 on the substrate 12. Each of the gate structures 26 preferably includes a patterned gate dielectric layer 28 and a patterned material layer 30.

In this embodiment, the substrate 12 could be a semiconductor substrate such as a silicon substrate, an epitaxial substrate, a SiC substrate, or a silicon-on-insulator (SOI) substrate, but not limited thereto. The gate dielectric layer 28 could include $SiO_2$, SiN, or high-k dielectric material and the gate material layer 30 could include metal, polysilicon, or silicide.

Preferably, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate, 12, and through an etching process, the pattern of the patterned mask is transferred to the substrate 12 to form the fin-shaped structure 14. Moreover, the formation of the fin-shaped structure 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure 14. These approaches for forming fin-shaped structure are all within the scope of the present invention.

Next, a lightly doped drain (LDD) 32 is formed adjacent two sides of the gate structure 26, at least a spacer 34 is formed on the sidewalls of the gate structure 26, and a source/drain region 36 and/or epitaxial layer (not shown) is formed in the substrate 12 adjacent to two sides of the spacer 34. In this embodiment, the spacer 34 could be a single spacer or a composite spacer. For instance, the spacer 34 could further include an offset spacer (not shown) and a main spacer (not shown), and the spacer 34 could be selected from the group consisting of $SiO_2$, SiN, SiON, and SiCN. The lightly doped drain 32, source/drain region 36, and epitaxial layer could include different dopants or different material depending on the type of transistor being fabricated. For instance, the lightly doped drain 32 and the source/drain region 36 could include p-type or n-type dopants and the epitaxial layer could include SiGe, SiC, or SiP.

Next, as shown in FIG. 2, an optional contact etch stop layer (CESL) (not shown) composed of silicon nitride could be selectively formed on the substrate 12 to cover the gate structure 26, and an interlayer dielectric (ILD) layer 40 is formed on the CESL. Next, a planarizing process, such as chemical mechanical polishing (CMP) process is conducted to remove part of the ILD layer 40 and part of the CESL to expose the gate material layer 30 composed of polysilicon so that the top surface of the gate material layer 30 and the top surface of the ILD layer 40 are coplanar.

Next, a replacement metal gate (RMG) process is conducted to transform the gate structures 26 into metal gates. The RMG process could be accomplished by first performing a selective dry etching or wet etching process, such as using etchants including ammonium hydroxide ($NH_4OH$) or tetramethylammonium hydroxide (TMAH) to remove the gate material layer 30 along with the gate dielectric layer 28 or interfacial layer underneath for forming recesses 42 in the ILD layer 30. The recesses 42 formed on the first region 16, second region 18, third region 20, and fourth region 22 at this stage preferably share an equal depth D1, in which the depth D1 is measured from the bottom of each recess 42 to the top surface of the ILD layer 40.

After the surface of the substrate 12 within the recesses 42 are exposed, a first mask 44, such as a patterned resist is formed on the first region 16 and the fourth region 22, and an etching process is conducted by using the first mask 44 as mask to extend the depth D1 of the recesses 42 downward on the second region 18 and third region 20 by removing part of the substrate 12 on the second region 18 and the third region 20. Preferably, the recesses 42 on the second region 18 and third region 20 now share slightly greater depth D2 measured from the bottom of the recesses 42 to the top surface of the ILD layer 40 while the depth D1 of the recesses 42 on the first region 16 and the fourth region 22 remain unchanged.

According to an embodiment of the present invention, it would also be desirable to conduct an extra etching process to remove part of the substrate 12 on all four regions 16, 18, 20, 22 at the same time prior to the formation of the first mask 44. After the recesses 42 on all four regions 16, 18, 20, 22 are extended downward so that the bottom surfaces of all the recess 42 on four regions 16, 18, 20, 22 are lower than the top surface of the substrate 12 or fin-shaped structure 14, the aforementioned steps of forming the first mask 44 and then using the first mask 44 to extend the recesses 42 on second region 18 and third region 20 downward could be carried out thereafter, which is also within the scope of the present invention.

Next, as shown in FIG. 3, after removing the first mask 44, another etching process is conducted by using the ILD layer 40 as mask to remove part of the fin-shaped structure 14 on the first region 16, second region 18, third region 20, and fourth region 22 at the same time. This extends the depth D1 of the recesses 42 on first region 16 and fourth region 22 as well as the depth D2 on second region 18 and third region 20 with equal increment downward so that the original depth D1 on first region 16 and fourth region 22 has now been extended to a new depth D3 while the depth D2 on second region 18 and third region 20 has been extended to a new depth D4.

Preferably, the etching process conducted in FIG. 2 for extending the depth D1 of the recesses 42 downward on second region 18 and third region 20 was preferably carried out under a first etching time and the etching process conducted in FIG. 3 for extending the depth D1 to depth D3 and extending depth D2 to depth D4 was carried out under a second etching time, in which the first etching time and the second etching time could be the same or different depending on the demand of the process.

Figure 4:
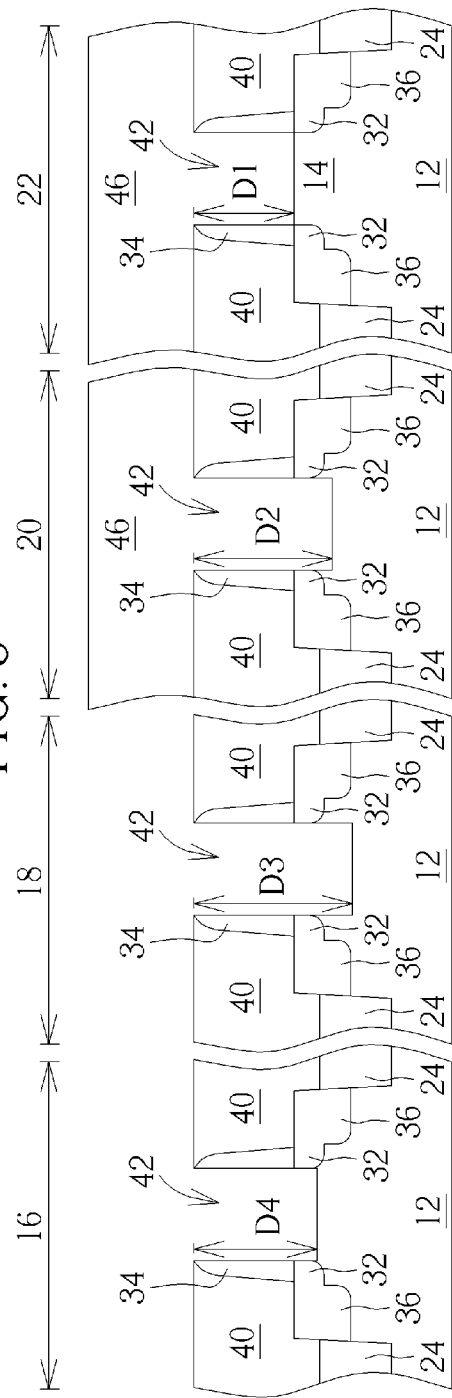
FIG. 4 illustrates a method for fabricating a semiconductor device according to an embodiment of the present invention.

Referring to FIGS. 1-2 and 4, FIGS. 1-2 and 4 illustrate a method for fabricating a semiconductor device according to a second embodiment of the present invention. As shown in FIG. 4, after extending the depth D1 of the recesses 42 on second region 18 and third region 20 to depth D2 as disclosed in FIG. 2, the first mask 44 is removed, and a second mask 46, such as another patterned resist is formed on the third region 20 and the fourth region 22. Next, an etching process is conducted by using the second mask 46 as mask to extend the depth D1 of the recess 42 on first region 16 and the depth D2 of the recess 42 on second region 18 downward by removing part of fin-shaped structure 14 or substrate 12 on the first region 16 and the second region 18 at the same time. This extends the original depth D1 on first region 16 to a new depth D4 and extends the depth D2 on second region 18 to a new depth D3 while the depth D2 on third region 20 and the depth D1 on fourth region 22 remain unchanged.

Preferably, the etching process conducted in FIG. 2 for extending the depth D1 of the recesses 42 downward on second region 18 and third region 20 was carried out under a first etching time and the etching process conducted in FIG. 4 for extending the depth D1 to depth D4 and extending the depth D2 to D4 was carried out under a second etching time, in which the first etching time and the second etching time are different.

By using different etching time to carryout the aforementioned etching processes individually, the new depth D4 formed on the first region 16 would be different from the depth D2 on the third region 20 depending on the duration of each etching time. For instance, if the duration of the first etching time were to be longer than the second etching time, the depth D2 formed on the third region 20 would be slightly greater than the depth D4 formed on the first region 16. Conversely, if the duration of the first etching time were to be shorter than the second etching time, the depth D2 formed on the third region 20 would be less than the depth D4 formed on the first region 16. As a result, four different depths D1, D2, D3, D4 could be obtained for the recesses 42 on the four regions 16, 18, 20, 22 at this stage and if viewing from another perspective, the fin-shaped structure 14 are also shaped or adjusted to have different heights on the four regions 16, 18, 20, 22 while the recesses 42 having different depths are formed.

Figure 5:
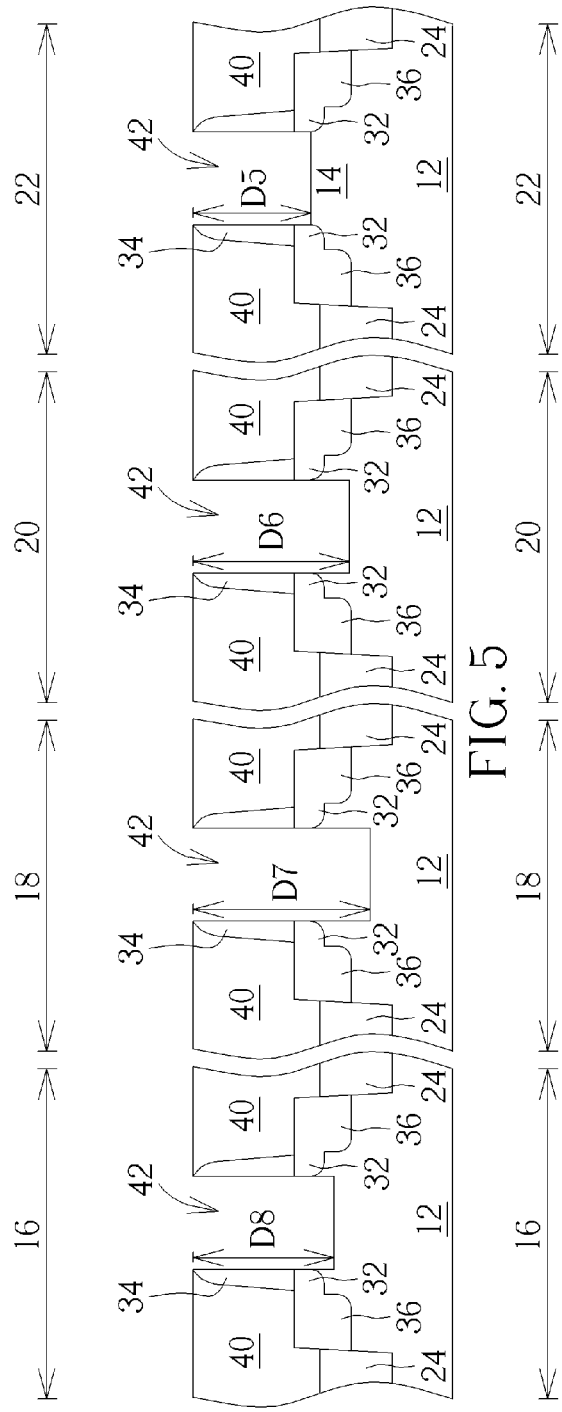
FIG. 5 illustrates a method for fabricating a semiconductor device according to an embodiment of the present invention.

Referring to FIG. 5, FIG. 5 illustrates a method for fabricating a semiconductor device according to an embodiment of the present invention. As shown in FIG. 5, after forming the four different depths D1, D2, D3, D4 as disclosed in FIG. 4, the second mask 46 could be removed, and an optional etching process could be conducted by using the ILD layer 40 as mask to further extend the depths D1, D2, D3, D4 downward at the same time so that new depths D5, D6, D7, D8 are formed on the fourth region 22, third region 20, second region 18, and first region 16 respectively. By doing so, the bottom of the recesses 42 on four regions 16, 18, 20, 22 would all be lower than the surface of the substrate 12 or fin-shaped structure 14.

Figure 6:
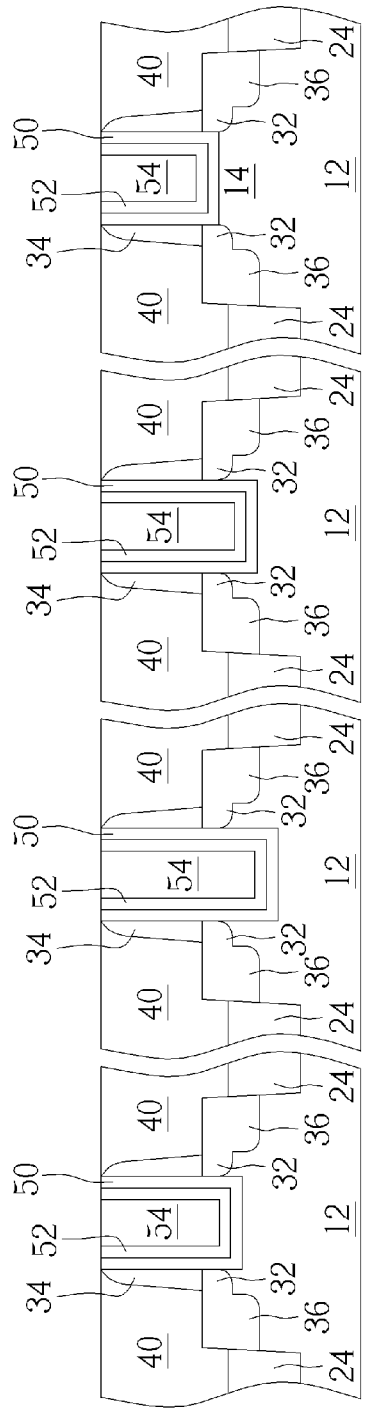
FIG. 6 illustrates a method for fabricating a semiconductor device according to an embodiment of the present invention.

As shown in FIG. 6, after the steps for forming the recesses 42 in FIG. 3, FIG. 4, or FIG. 5 are completed, it would be desirable to continue the RMG process by sequentially forming a high-k dielectric layer 50 and a conductive layer including at least a U-shaped work function metal layer 52 and a low resistance metal layer 54 in the recesses, and a planarizing process is conducted so that the surfaces of the U-shaped high-k dielectric layer 50, U-shaped work function metal layer 52, low resistance metal layer 54, and ILD layer 40 are coplanar.

In this embodiment, the high-k dielectric layer 50 is preferably selected from dielectric materials having dielectric constant (k value) larger than 4. For instance, the high-k dielectric layer 50 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 52 is formed for tuning the work function of the later formed metal gates to be appropriate in an NMOS or a PMOS. For an NMOS transistor, the work function metal layer 52 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 52 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 52 and the low resistance metal layer 54, in which the material of the barrier layer may include titanium (Ti), titanium nitride (TiN), tantalum (Ta) or tantalum nitride (TaN). Furthermore, the material of the low-resistance metal layer 44 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

Next, part of the high-k dielectric layer 50, part of the work function metal layer 52, and part of the low resistance metal layer 54 could be removed to form recesses (not shown), and hard masks (not shown) could be formed in the recesses so that the top surfaces of the hard masks and ILD layer 40 are coplanar. The hard masks could be selected from the group consisting of silicon oxide, silicon nitride, silicon oxynitride, and silicon carbon nitride. Afterwards, a contact plug formation could be conducted to form contact plugs in the ILD layer 40 for electrically connecting the source/drain regions 36.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a first region and a second region;
   forming a first gate structure on the first region and a second gate structure on the second region;
   forming an interlayer dielectric (ILD) layer around the first gate structure and the second gate structure;
   removing the first gate structure and the second gate structure to expose the substrate on the first region and the second region;
   removing part of the substrate on the second region to form a first recess exposing the substrate;
   removing part of the substrate on the first region to form a second recess exposing the substrate, wherein the depths of the first recess and the second recess are different and the substrate exposed by the first recess and the substrate exposed by the second recess comprise same material; and
   forming a first metal gate on the first region and a second metal gate on the second region.

2. The method of claim 1, further comprising:
   forming a first mask on the first region;
   using the first mask as mask to form the first recess;
   removing the first mask;
   using the ILD layer as mask to remove part of the substrate on the first region and part of the substrate on the second region.

3. The method of claim 2, further comprising:
   using the first mask to remove part of the substrate on the second region under a first etching time; and
   using the ILD layer as mask to remove part of the substrate on the first region and part of the substrate on the second region under a second etching time, wherein the first etching time and the second etching time are the same.

4. The method of claim 2, further comprising:
   using the first mask to remove part of the substrate on the second region under a first etching time; and
   using the ILD layer as mask to remove part of the substrate on the first region and part of the substrate on the second region under a second etching time, wherein the first etching time and the second etching time are different.

5. The method of claim 1, further comprising:
forming a first mask on the first region;
using the first mask as mask to form the first recess;
removing the first mask;
forming a second mask on the second region; and
using the second mask as mask to form the second recess.

6. The method of claim 5, further comprising:
using the first mask to form the first recess under a first etching time;
using the second mask to form the second recess under a second etching time, wherein the first etching time and the second etching time are different.

7. The method of claim 1, wherein the first metal gate comprises:
a first work function metal layer; and
a first low resistance metal layer on the first work function metal layer.

8. The method of claim 7, wherein the second metal gate comprises:
a second work function metal layer; and
a second low resistance metal layer on the second work function metal layer.

9. The method of claim 8, wherein the first work function metal layer and the second work function metal layer comprise different conductive type.

10. The method of claim 1, wherein the first metal gate and the second metal gate comprise different heights and a bottom surface of at least one of the first metal gate and the second metal gate is lower than a top surface of the substrate.

* * * * *